United States Patent
Ogawa et al.

(10) Patent No.: US 7,011,483 B2
(45) Date of Patent: Mar. 14, 2006

(54) LOAD PORT, SEMICONDUCTOR MANUFACTURING APPARATUS, SEMICONDUCTOR MANUFACTURING METHOD, AND METHOD OF DETECTING WAFER ADAPTER

(75) Inventors: Yasutaka Ogawa, Kasugai (JP); Shigenori Kawase, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 284 days.

(21) Appl. No.: 10/389,794

(22) Filed: Mar. 18, 2003

(65) Prior Publication Data

US 2003/0199173 A1    Oct. 23, 2003

(30) Foreign Application Priority Data

Apr. 22, 2002    (JP) ............................. 2002-118801

(51) Int. Cl.
*B65G 65/00*        (2006.01)
(52) U.S. Cl. .............................. 414/217.1; 414/331.03; 414/937
(58) Field of Classification Search ............. 414/217.1, 414/331.03, 937, 938
See application file for complete search history.

(56) References Cited

U.S. PATENT DOCUMENTS

| 5,605,428 | A | * | 2/1997 | Birkner et al. ......... 414/331.15 |
| 5,993,081 | A | * | 11/1999 | Itoh et al. .................. 396/611 |
| 6,039,186 | A | * | 3/2000 | Bhatt et al. ................ 206/711 |
| 6,120,229 | A | * | 9/2000 | Hofmeister ................ 414/217 |
| 6,188,323 | B1 | * | 2/2001 | Rosenquist et al. ...... 340/686.5 |
| 6,193,459 | B1 | * | 2/2001 | Rush ........................... 104/35 |
| 6,203,268 | B1 | * | 3/2001 | Miyashita ................. 414/757 |
| 6,431,806 | B1 | * | 8/2002 | Doche ........................ 414/217 |
| 6,632,068 | B1 | * | 10/2003 | Zinger et al. .............. 414/800 |
| 6,830,651 | B1 | * | 12/2004 | Obikane ................ 156/345.31 |
| 6,874,638 | B1 | * | 4/2005 | Iijima et al. ................ 206/711 |
| 6,884,639 | B1 | * | 4/2005 | Dougan et al. .............. 438/14 |

* cited by examiner

*Primary Examiner*—Thomas J. Brahan
(74) *Attorney, Agent, or Firm*—Westerman, Hattori, Daniels & Adrian, LLP

(57) ABSTRACT

A load port includes an adapter-detecting sensor arranged at an upper portion of an opener. When the opener opens a lid of a FOUP, the adapter-detecting sensor detects whether a wafer adapter is mounted in the FOUP, and notifies a control unit of a semiconductor manufacturing apparatus of the result of the detection. The control unit determines the size of semiconductor wafers based on the result of the detection and carries out processing operation dependent on the size of the wafers in a processing chamber.

16 Claims, 10 Drawing Sheets

LOAD PORT, SEMICONDUCTOR MANUFACTURING APPARATUS, SEMICONDUCTOR MANUFACTURING METHOD, AND METHOD OF DETECTING WAFER ADAPTER

CROSS-REFERENCE TO RELATED APPLICATION

This application is based upon and claims the benefit of priority from the prior Japanese Patent Application No. 2002-118801 filed on Apr. 22, 2002, the entire contents of which are incorporated herein by reference.

BACKGROUND OF THE INVENTION

The present invention relates to a load port, a semiconductor manufacturing apparatus, a semiconductor manufacturing method, and a method of detecting a wafer adapter.

In a semiconductor manufacturing factory, a wide variety of products are produced in respective limited amounts. To this end, semiconductor wafers having various different sizes are conveyed on a single production line on a lot-by-lot basis. Processing devices arranged on the production line perform different processing operations on the wafers, depending on the sizes of the wafers. To properly transfer and process the wafers, it is necessary to detect the sizes of the wafers efficiently.

Generally, semiconductor wafers are contained in an open-type cassette called an open cassette, and carried to a manufacturing apparatus that performs processing operations, such as etching, CVD (Chemical Vapor Deposition), and PVD (Physical Vapor Deposition). The open cassette is capable of containing a plurality of semiconductor wafers. Within the open cassette, wafers are stacked at a predetermined interval. Semiconductor wafers are increasing in size with the advance in semiconductor manufacturing technology. Recently, 8-inch and 12-inch semiconductor wafers are used. This leads to an increase in the size of cassettes.

Although the cassettes have horizontal sizes dependent on the diameters of wafers, they have predetermined vertical sizes (heights). For instance, cassettes for accommodating 4-inch, 5-inch, and 6-inch semiconductor wafers have a vertical size (height) large enough to accommodate twenty-five wafers at a pitch of 4.76 mm. A cassette for accommodating 8-inch semiconductor wafers has a vertical size (height) large enough to accommodate twenty-five wafers at a pitch of 6.35 mm. A cassette for accommodating 12-inch semiconductor wafers has a vertical size (height) large enough to accommodate twenty-five wafers at a pitch of 10 mm.

In a general semiconductor production line, a closed-type container is used. The closed-type container includes an SMIF (Standard Mechanical Interface) pod 20 shown in FIG. 1, and a FOUP (Front Opening Unified Pod) 21 shown in FIG. 2. The SMIF pod 20 and the FOUP 21 transfer a plurality of semiconductor wafers to a manufacturing apparatus while maintaining their inner spaces for containing the wafers at a high level of cleanliness.

The SMIF pod 20 is a casing for containing a wafer cassette. On the other hand, the FOUP 21 has an inner wall formed with a shelf 22 for holding a plurality of semiconductor wafers. The shelf 22 has a plurality of layers of slots 22a. Each slot 22a holds one semiconductor wafer. The FOUP 21 compliant with SEMI (Semiconductor Equipment and Materials International) standards is configured such that semiconductor wafers can be taken in and out by opening a lid 23 arranged in the front of the FOUP 21.

FIG. 3 is a plan view of a conventional semiconductor manufacturing apparatus 30 which transfers semiconductor wafers W by using the FOUP 21. Two load ports 31, 32 are arranged on the front of the apparatus 30 (on a right-hand side as viewed in the figure) in a manner adjacent to each other. The FOUP 21 is placed on each of the load ports 31, 32. The load ports 31, 32 are constructed in accordance with the SEMI standards. Each load port includes an opener 33 for opening and closing the lid 23 of the FOUP 21. When the opener 33 opens the lid 23 of the FOUP 21, a transfer robot 34 carries wafers W from the FOUP 21 into the semiconductor manufacturing apparatus 30.

The semiconductor manufacturing apparatus 30 is capable of processing 8-inch semiconductor wafers and 12-inch semiconductor wafers. More specifically, the apparatus 30 is based on equipment for processing 12-inch (300-mm) wafers and modified such that it can deal with 8-inch (200-mm) wafers as well. Wafers W are transferred between the apparatus 30 and the FOUP 21. The FOUP 21, which is a transfer pod for transferring 12-inch wafers, cannot hold 8-inch wafers W. To overcome this problem, a wafer adapter 25 shown in FIG. 4 is mounted in the FOUP 21 to thereby enable the FOUP 21 to contain 8-inch wafers W. The wafer adapter 25 has a side wall 26 which is formed to fit on peripheries of 8-inch wafers W. The side wall 26 is formed with a plurality of layers of slots 26a. Each slot 26a holds one wafer W.

It should be noted that a pitch at which 8-inch wafers W are accommodated is different from a pitch at which 12-inch wafers W are accommodated. Further, in the FOUP 21, each 12-inch wafer W set on the shelf 22, and each 8-inch wafer W set by using the wafer adapter 25 are arranged such that end portions thereof toward the apparatus 30 are in the same position, and hence the position of the center of the 8-inch wafer is different from that of the center of the 12-inch wafer. The transfer robot 34 carries a wafer W on a hand 34a thereof. To transfer the wafer W accurately, the transfer robot 34 is required to recognize the size of the wafer and cause the center of the wafer W to coincide with the center of the hand 34a. Therefore, it is necessary to recognize the size of the wafer.

The semiconductor manufacturing apparatus 30 includes a charge coupled device (CCD) camera 36, and a controller 37 for controlling the CCD camera 36. Whether or not the wafer adapter 25 is mounted in the FOUP 21 is detected based on data of an image thereof taken by the CCD camera 36. The apparatus 30 recognizes the size of a wafer to be processed according to a result of the detection.

However, to detect the wafer adapter 25 by the CCD camera 36, it is necessary to take into account the color of the FOUP 21, and brightness around the FOUP 21. Further, a location for setting the CCD camera 36 is restricted by the SEMI standards. To meet these conditions for detecting the wafer adapter 25, the apparatus necessarily has a complicated construction.

Since the load ports 31, 32 are constructed in accordance with the SEMI standards, it is impossible to provide a space for arranging the CCD camera 36 and the controller 37 in the load ports 31, 32. For this reason, the CCD camera 36 and the controller 37 are arranged on an opposite side of (rearward of) the load ports 31, 32 with respect to the transfer robot 34. This arrangement causes an increase in the floor area of the semiconductor manufacturing apparatus 30, resulting in the increased size thereof.

SUMMARY OF THE INVENTION

It is an object of the present invention to provide load ports, a semiconductor manufacturing apparatus, a semiconductor manufacturing method, and a method of detecting a wafer adapter, which are capable of easily detecting whether a wafer adapter is mounted in a FOUP.

To achieve the above object, the present invention is a load port for placing thereon a front-opening type pod accommodating first semiconductor wafers having a first predetermined size. The pod includes a lid and when a wafer adapter is mounted in the pod, the pod is capable of containing second semiconductor wafers having a second predetermined size different from the first predetermined size. The load port includes an opener for opening the lid of the pod and an adapter-detecting sensor for detecting whether the wafer adapter is mounted in the pod. An output circuit in electronic communication with the adapter-detecting sensor generates an electric signal indicative of a result of detection by the adapter-detecting sensor.

A further perspective of the present invention is a semiconductor manufacturing apparatus for use with a front-opening type pod accommodating first semiconductor wafers having a first predetermined size. The pod includes a lid and when a wafer adapter is mounted in the pod, the pod is capable of containing second semiconductor wafers having a second predetermined size different from the first predetermined size. The semiconductor manufacturing apparatus includes a load port on which the pod is placed, an opener arranged at the load port for opening the lid, an optical adapter-detecting sensor arranged at the load port. The optical adapter-detecting sensor detects whether the wafer adapter is mounted in the pod when the opener opens the lid of the pod, and generates a detection signal. A processing chamber carries out at least one processing operation on the semiconductor wafers depending on the size of the semiconductor wafers in accordance with the detection signal.

A further perspective of the present invention is a method for manufacturing semiconductor devices. The method includes accommodating first semiconductor wafers having a first predetermined size in a front-opening type pod or mounting a wafer adapter in the pod and accommodating second semiconductor wafers having a second predetermined size different from the first predetermined size in the pod, setting the pod on a load port, opening a lid of the pod, optically detecting whether the wafer adapter is mounted in the pod, determining the size of the semiconductor wafers contained in the pod based on a result of the detection, carrying the semiconductor wafers from the pod to a processing chamber, and executing at least one processing operation depending on the size of the semiconductor wafers in the processing chamber.

A further perspective of the present invention is a method for detecting whether a front-opening type pod for containing first semiconductor wafers of a first predetermined size has a wafer adapter mounted therein for accommodating second semiconductor wafers of a second predetermined size different from the first predetermined size, wherein the pod includes a lid. The method includes setting the pod on the load port, bringing an opener into engagement with the lid of the pod and moving the opener downward together with the lid to open the lid, and optically detecting whether the wafer adapter is mounted in the pod by a sensor arranged at an upper portion of the opener, while opening the lid.

A further perspective of the present invention is a load port for use with a front-opening type pod capable of containing first semiconductor wafers of a first predetermined size. The pod includes a lid and when a wafer adapter is mounted in the pod, the pod is capable of containing second semiconductor wafers of a second predetermined size different from the first predetermined size. The load port includes a carrier stage for supporting the pod, an opener for opening the lid of the pod by engaging with the lid and moving downward together with the lid, and an adapter-detecting sensor arranged at an upper portion of the opener for detecting whether the wafer adapter is mounted in the pod, the adapter-detecting sensor including a light-irradiating device for irradiating light toward the wafer adapter, and a light-receiving device for receiving light reflected by the wafer adapter when light is irradiated towards the wafer adapter by the light-irradiating device.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENT

Figure 5:
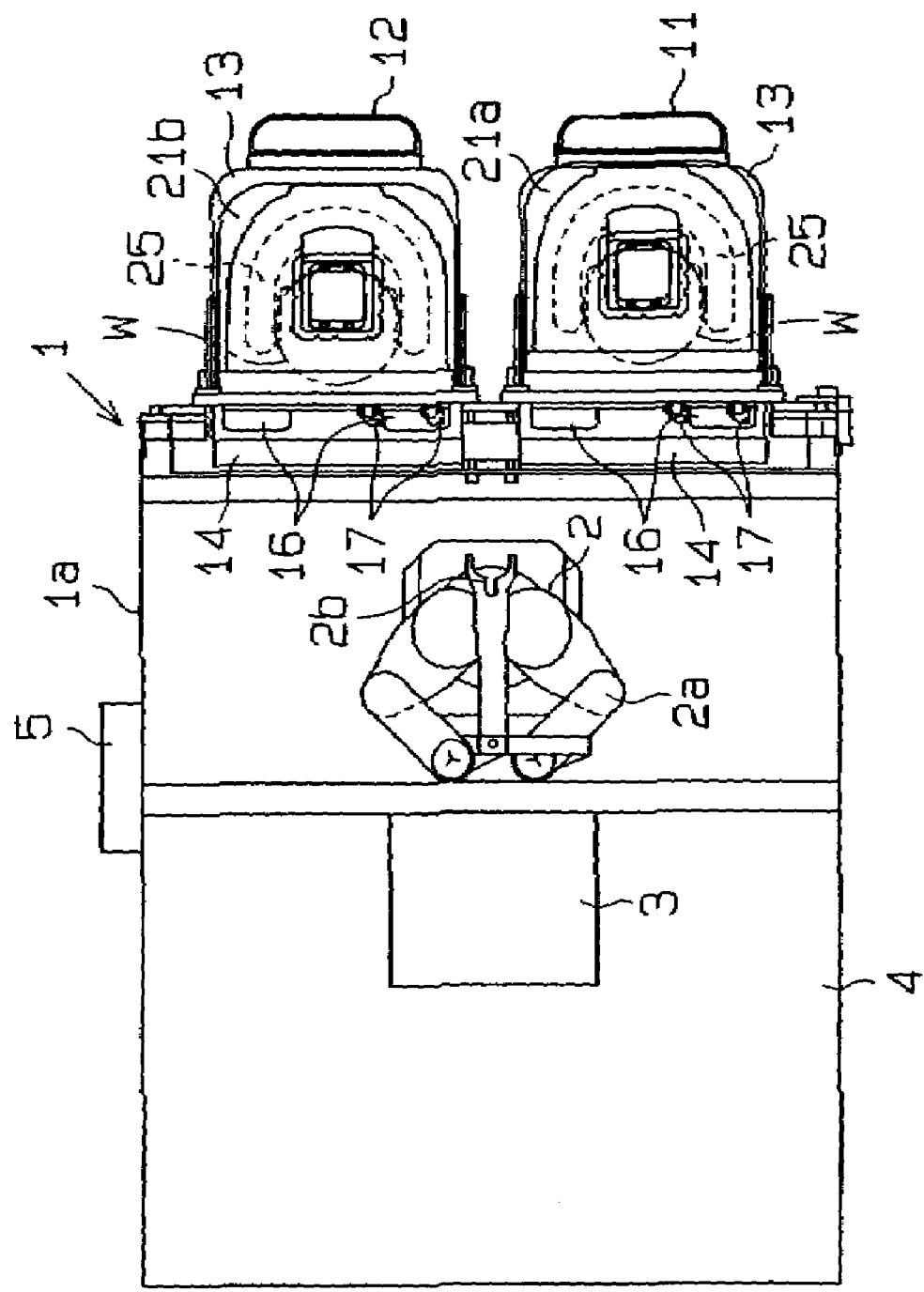
FIG. 5 is a plan view of a semiconductor manufacturing apparatus according to an embodiment of the present invention.
Figure 6:
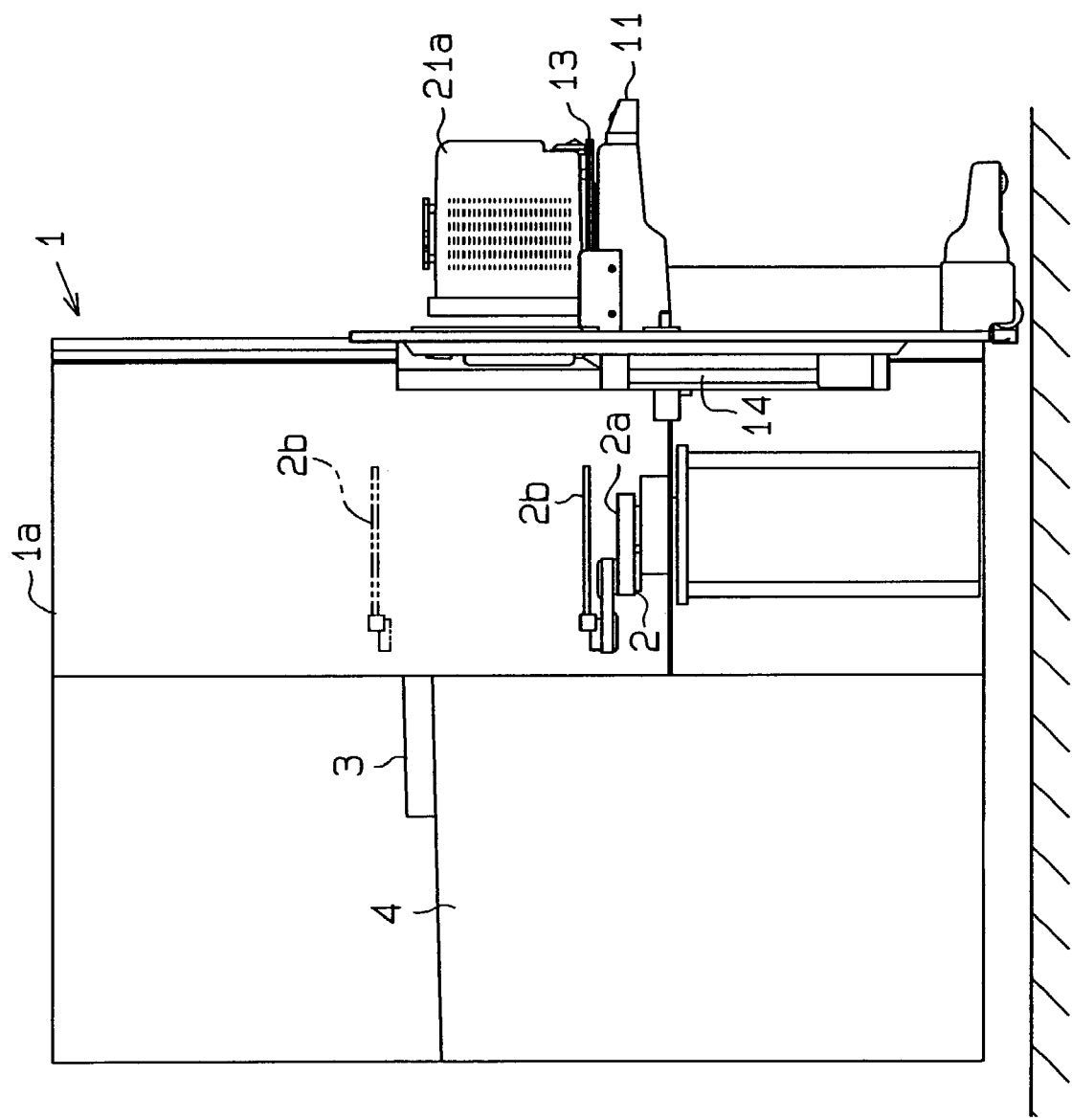
FIG. 6 is a side view of the semiconductor manufacturing apparatus of FIG. 5.

A semiconductor manufacturing apparatus according to an embodiment of the present invention will now be described in detail with reference to FIGS. 5 and 6. FIG. 5 shows the semiconductor manufacturing apparatus 1 with a casing 1a having an upper portion thereof omitted. FIG. 6 shows the semiconductor manufacturing apparatus 1 with the casing 1a having side portions thereof omitted.

The semiconductor manufacturing apparatus 1 includes a transfer robot 2, an alignment unit 3, a processing chamber 4, a control unit 5, a first load port 11 and a second load port 12. The transfer robot 2, the alignment unit 3, and the processing chamber 4 are covered by the casing 1a. The casing 1a has the inside thereof maintained at a high level of cleanliness. The first and second load ports 11, 12 are arranged on the front of the casing 1a and have carrier stages 13 for supporting FOUPs (Front Opening Unified Pods) 21a, 21b, respectively.

Figure 4:
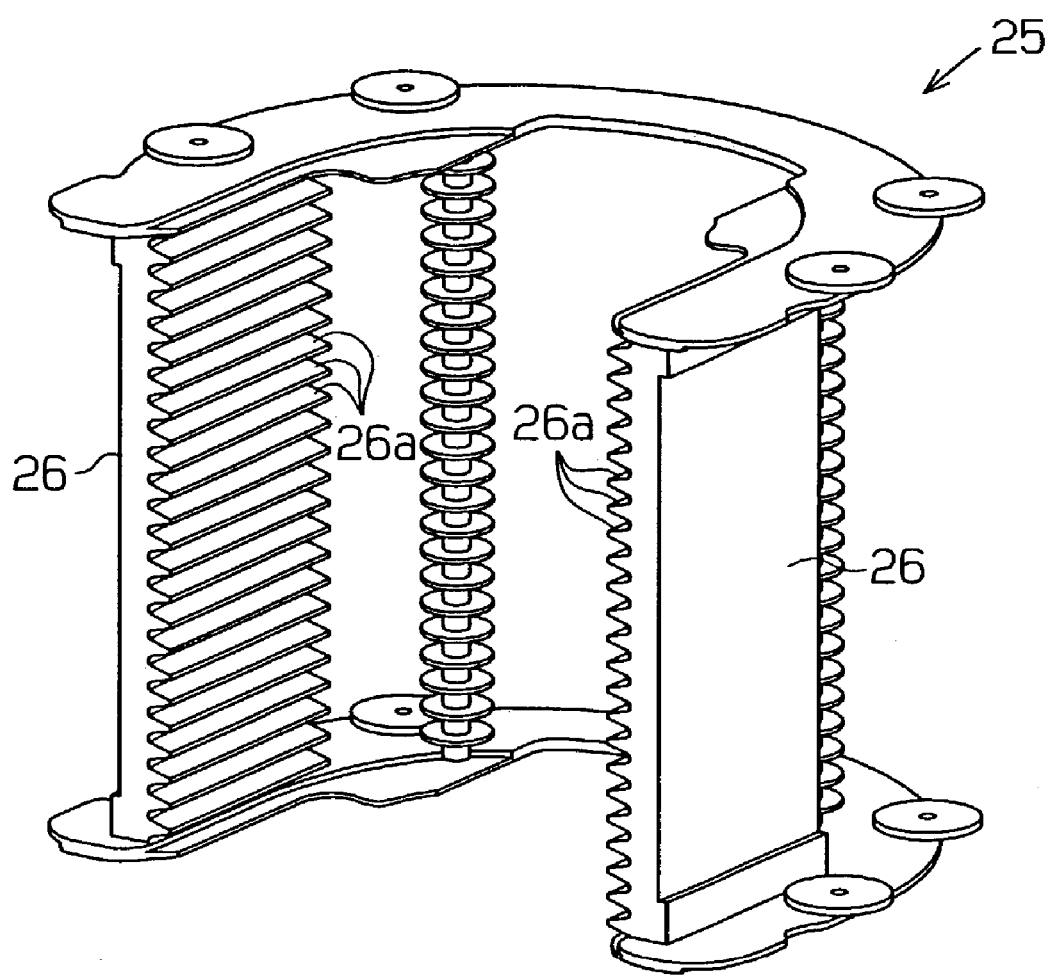
FIG. 4 is a perspective view of a standard wafer adapter.

The semiconductor manufacturing apparatus 1 processes 8-inch (approximately 200-mm) and/or 12-inch (approximately 300-mm) semiconductor wafers W. The FOUPs 21a, 21b are transfer pods constructed in accordance with the SEMI standards for transferring 12-inch wafers W. When a wafer adapter 25 illustrated in FIG. 4 is mounted in each of the FOUPs 21a, 21b, it becomes possible for the FOUPs 21a, 21b to transfer 8-inch wafers W.

The transfer robot 2 includes two articulated arms 2a. Each arm 2a has a hand 2b, and performs vertical movement and rotation for moving the hand 2b. The hands 2b transfer wafers W between the FOUPs 21a, 21b and the alignment unit 3. For instance, the transfer robot 2 removes a wafer W from the FOUP 21a, and transfers the wafer W to the alignment unit 3. The alignment unit 3 detects an alignment notch formed in the wafer W and effects alignment of the wafer W. Then, the alignment unit 3 brings the aligned wafer W into the processing chamber 4. In the processing chamber 4, etch processing, for instance, is carried out for forming a wiring pattern on the wafer W. The transfer robot 2 removes the processed wafer W from the processing chamber 4 to return the same to the FOUP 21a from which it was removed. Similarly, a wafer W removed from the FOUP 21b is returned to the FOUP 21b after being processed in the processing chamber 4.

Next, the first load port 11 will be described hereinafter. The second load port 12 has the same construction as that of the first load port 11.

Figure 7:
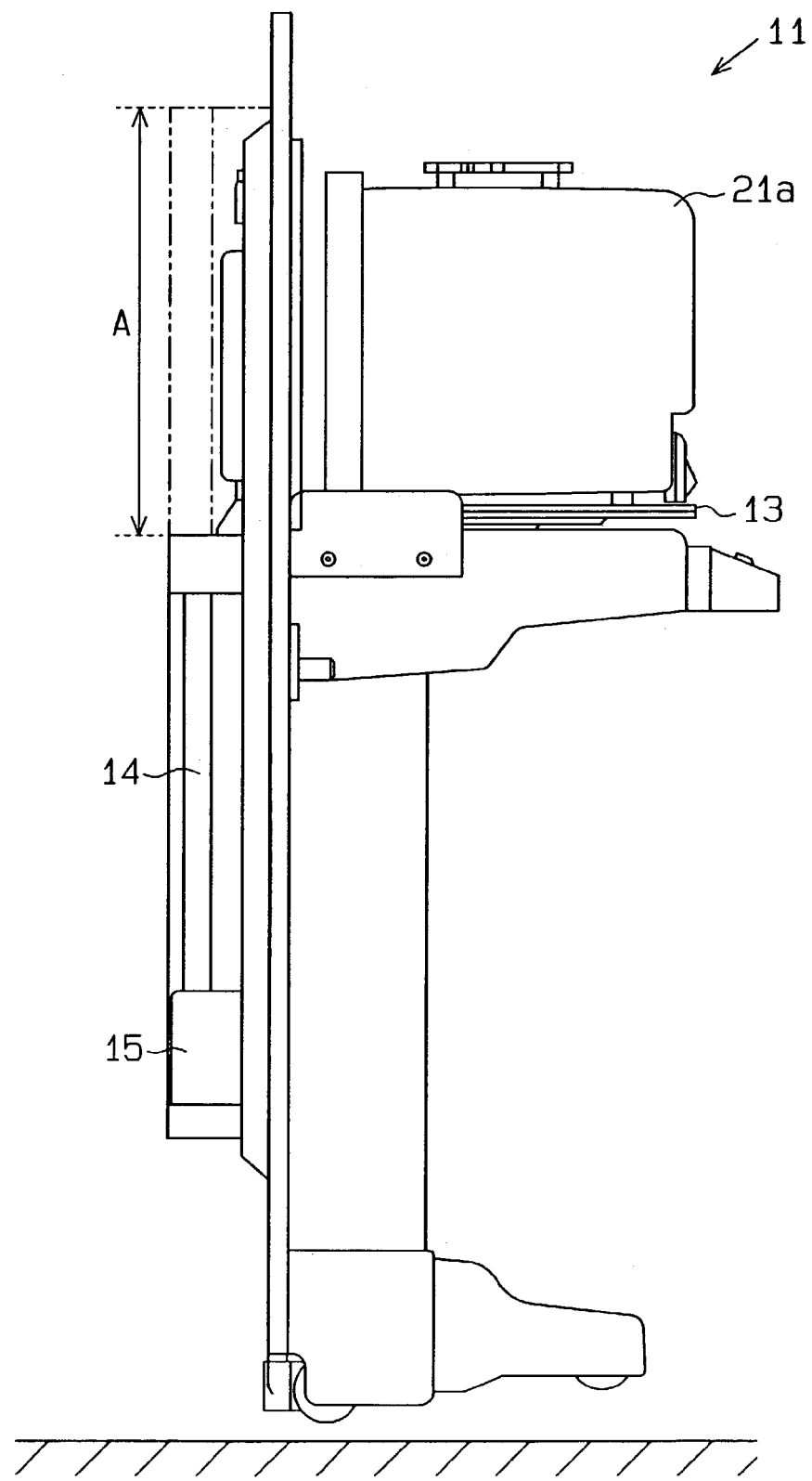
FIG. 7 is a side view of a load port according to an embodiment of the present invention.
Figure 10:
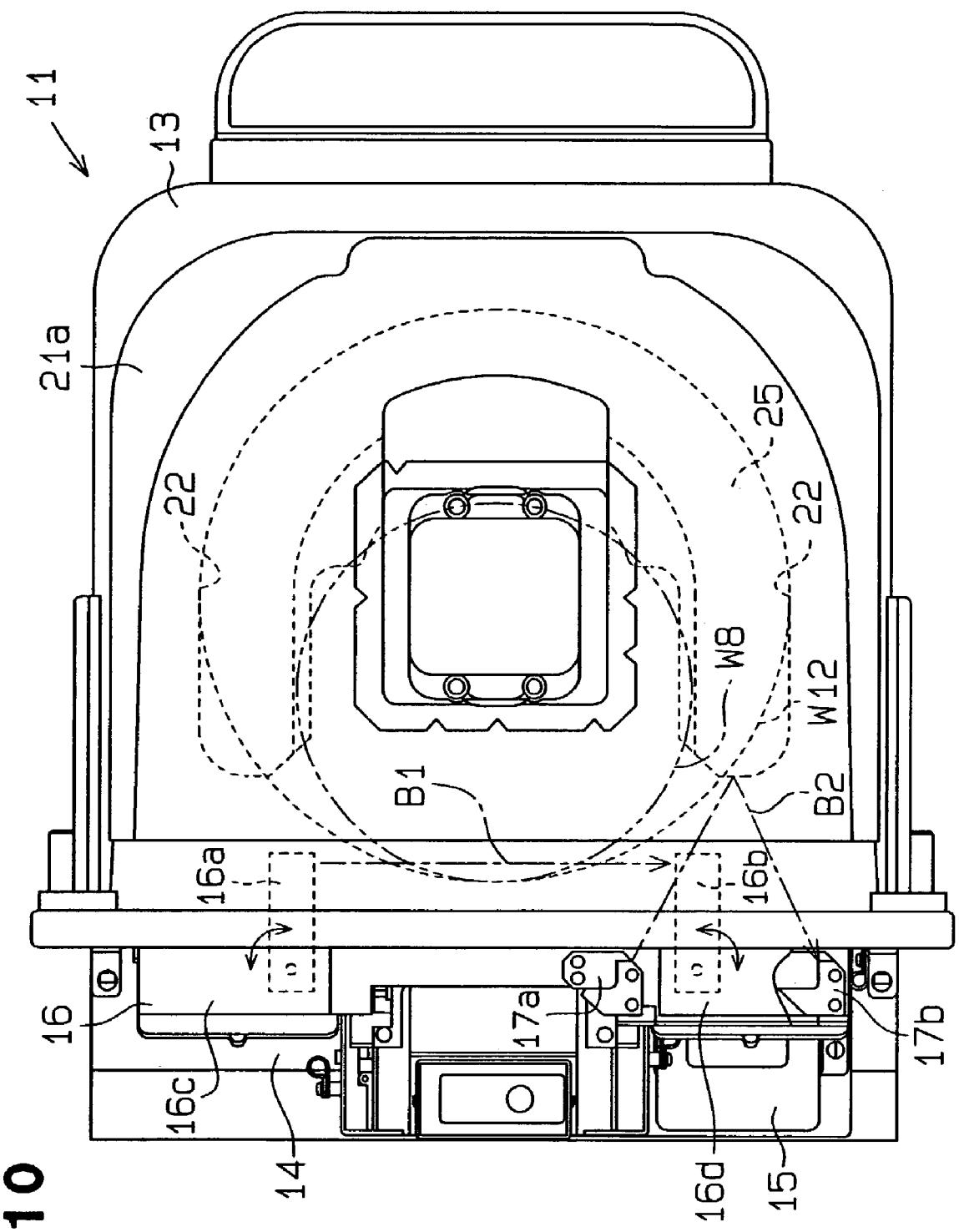
FIG. 10 is a plan view of the load port of FIG. 7.

Referring to FIG. 7, the FOUP 21a is placed on the carrier stage 13 of the first load port 11. FIG. 10 shows a state in which the FOUP 21a is docked with the first load port 11. In this specification, the right-hand side as viewed in FIG. 7 is referred to as the "front" side of the first load port 11, and the left-hand side as viewed in FIG. 7 is referred to as the "rear" side of the first load port 11.

As shown in FIGS. 7 to 10, an opener 14 for opening and closing a lid 23 of the FOUP 21 is formed in the rear of the first load port 11. The opener 14 is vertically moved by a motor 15 into and out of an area A shown in FIGS. 7 and 9.

Figure 8:
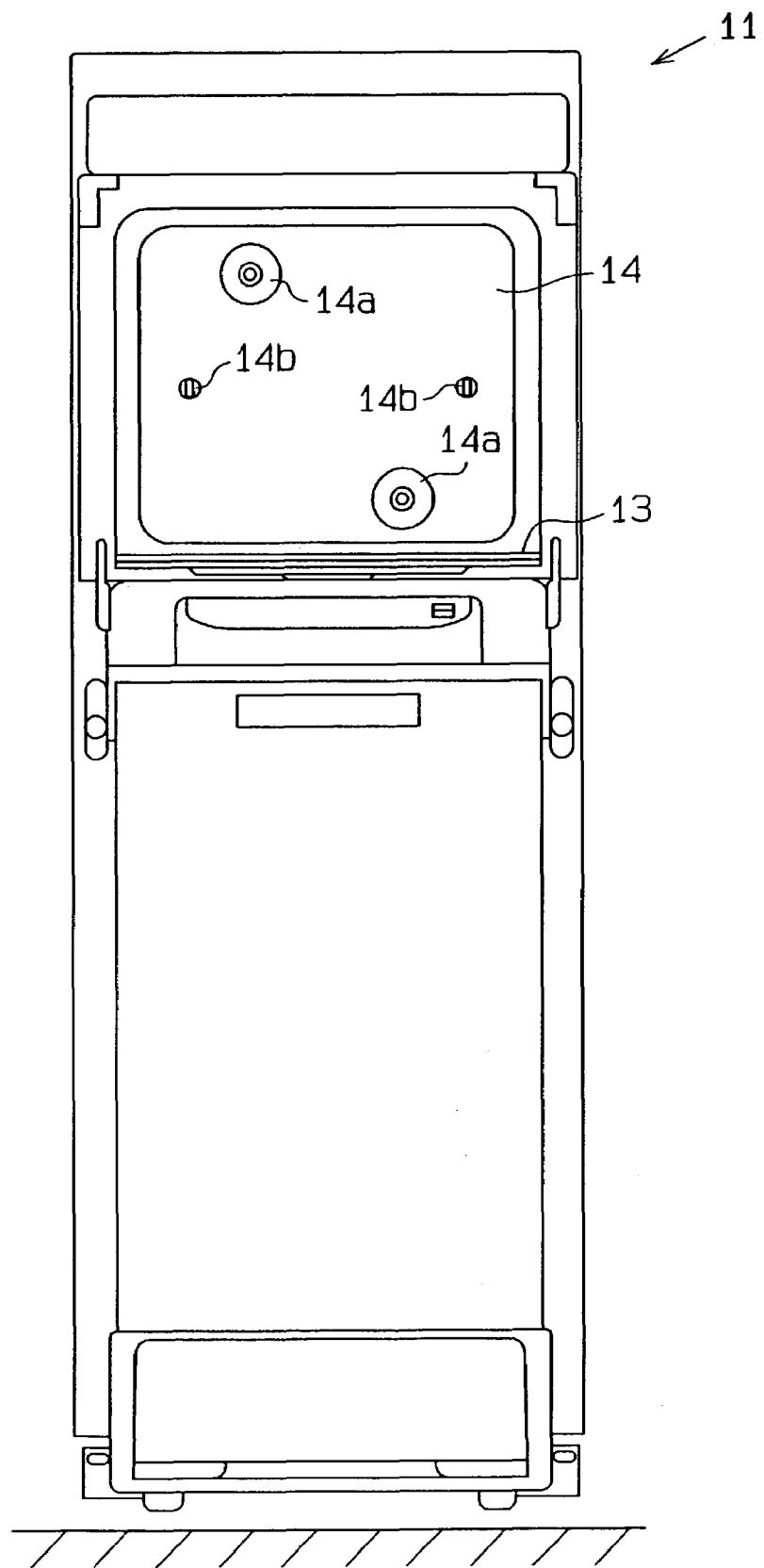
FIG. 8 is a front view of the load port of FIG. 7.

Referring to FIG. 8, the opener 14 includes two circular suction portions 14a for suction adhering to the lid 23 of the FOUP 21, and two locking levers 14b. The two suction portions 14a are arranged in diagonally opposite positions on the surface (opposed surface) of the opener 14 facing the FOUP 21. The two locking levers 14b are arranged at substantially the same level.

Figure 1:
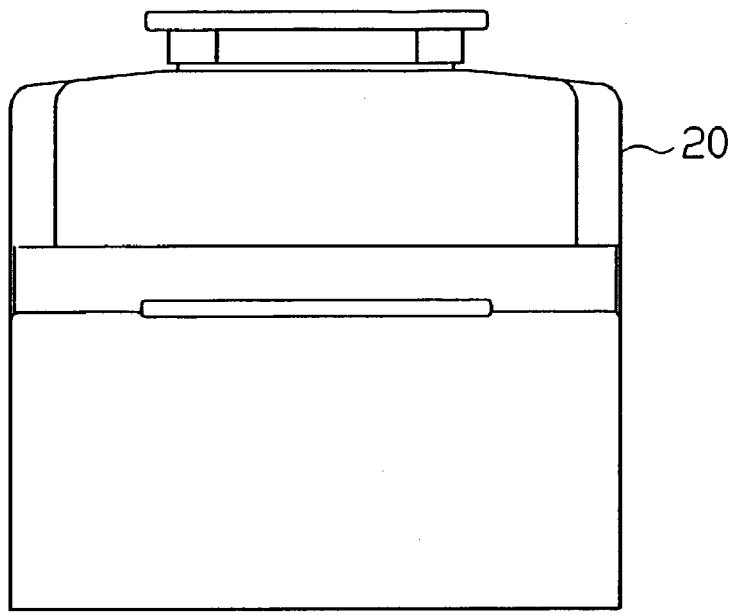
FIG. 1 is a side view of a SMIF pod.
Figure 2A:
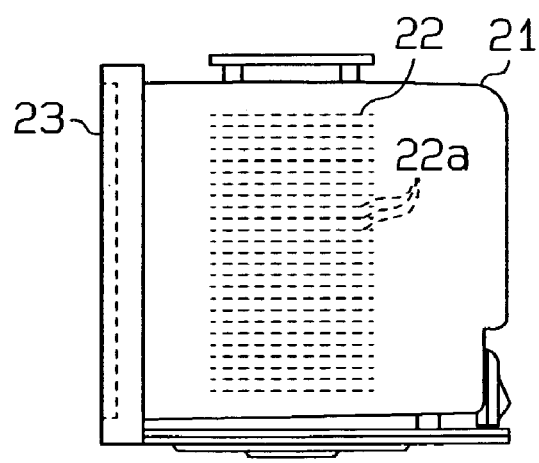
FIGS. 2A and 2B are a side view and a front view of a FOUP, respectively.
Figure 2B:
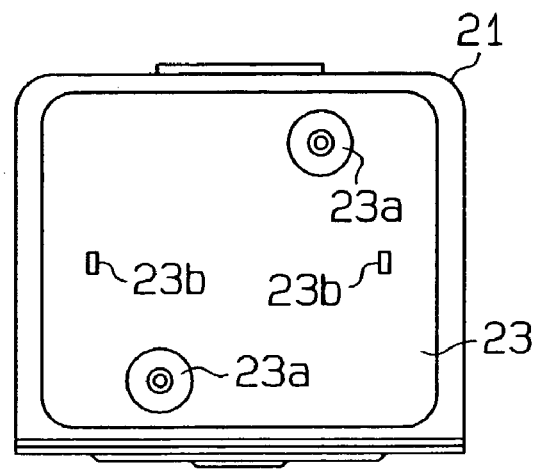
Figure 3:
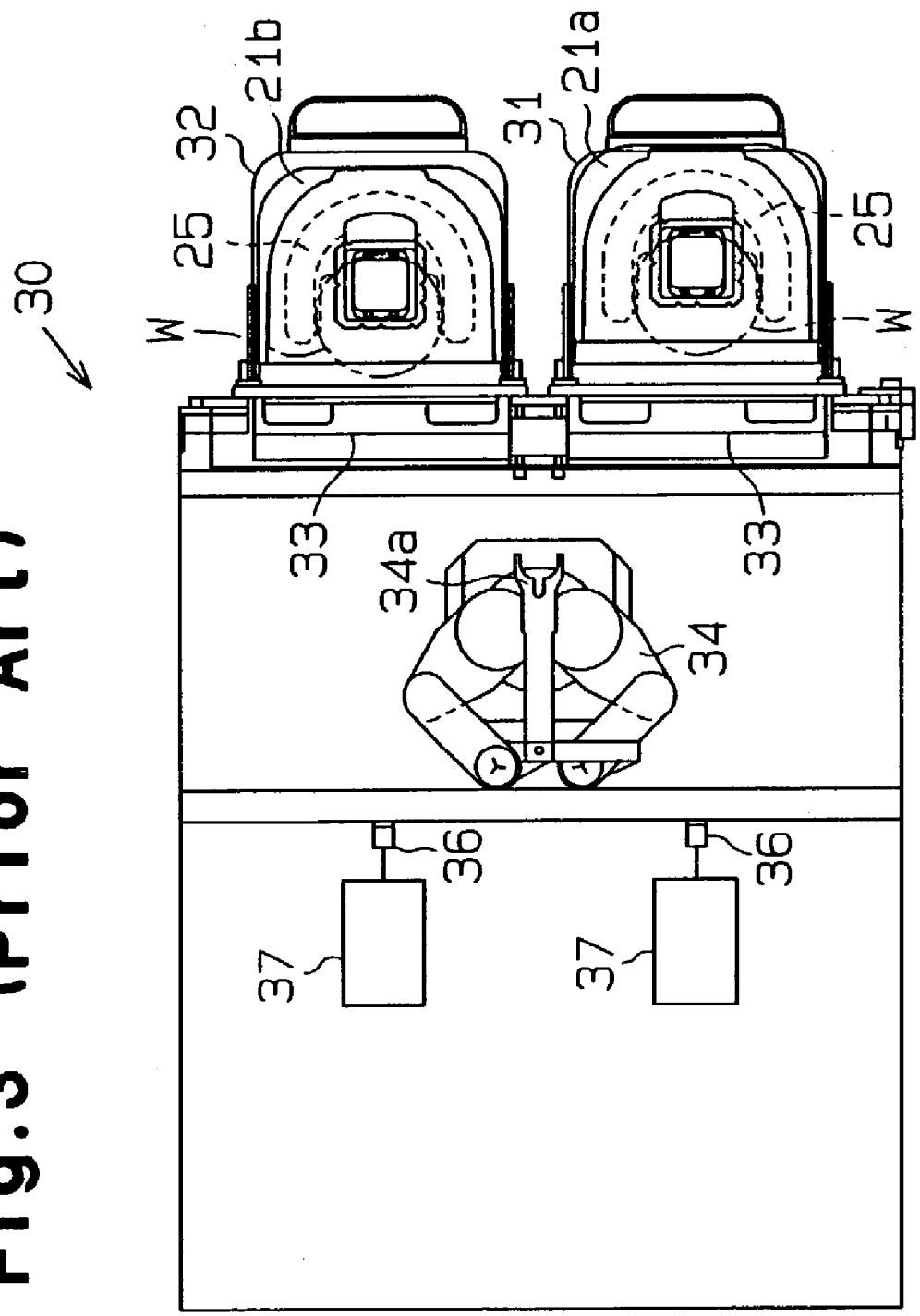
FIG. 3 is a plan view of a conventional semiconductor manufacturing apparatus.

As shown in FIG. 2B, the lid 23 of the FOUP 21 has two circular suction receiving portions 23a arranged at locations corresponding to the suction portions 14a of the opener 14, and two locking holes 23b arranged at locations corresponding to the locking levers 14b of the opener 14.

When the lid 23 of the FOUP 21 is opened, the suction portions 14a of the opener 14 are caused to adhere to the suction receiving portions 23a of the lid 23 of the FOUP 21, whereby the opener 14 and the lid 23 are aligned with each other. The above adhesion is carried out by vacuum suction. Then, the locking levers 14b of the opener 14 are inserted into the locking holes 23b of the FOUP 21 and locked, and the opener 14 is moved downward to thereby remove the lid 23 from the FOUP 21.

Figure 9:
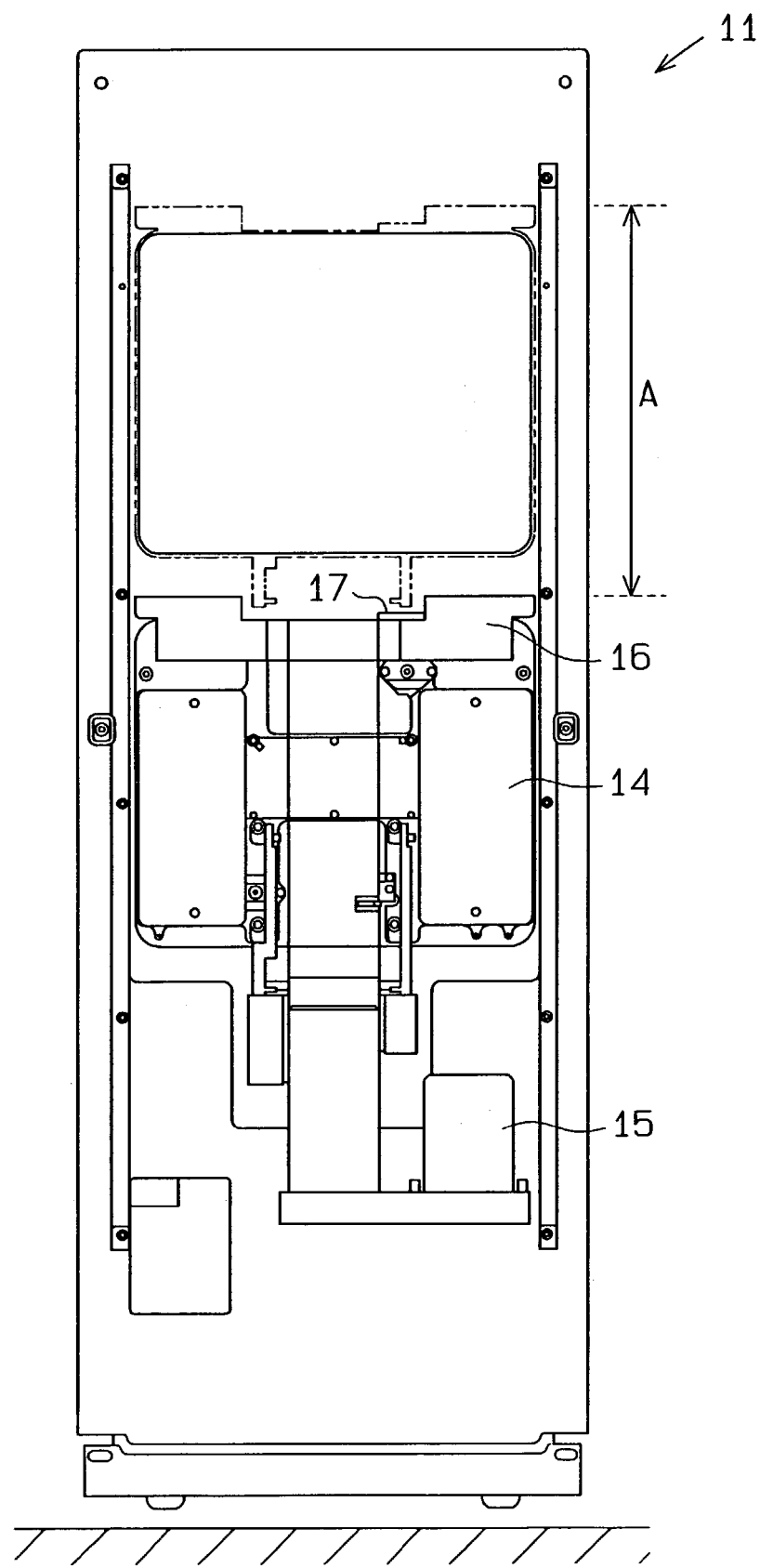
FIG. 9 is a rear view of the load port of FIG. 7.

Referring to FIGS. 9 and 10, the load port 11 includes a wafer-detecting sensor 16, and an adapter-detecting sensor 17 arranged adjacent to the wafer-detecting sensor 16. It is preferred that the sensors 16, 17 are arranged at upper portions of the opener 14.

As shown in FIG. 10, the wafer-detecting sensor 16 includes a light-irradiating device 16a for irradiating a laser beam, and a light-receiving device 16b for receiving the laser beam. The light-irradiating device 16a and the light-receiving device 16b are arranged on an upper end of the opener 14 such that they are separated from each other in the direction of the width of the opener 14. Normally, the light-irradiating device 16a and the light-receiving device 16b are contained in sensor casings 16c and 16d, respectively. When the opener 14 opens the lid 23 of the FOUP 21, each of the light-irradiating device 16a and the light-receiving device 16b is rotated by 90 degrees about one end thereof as a fulcrum. When the rotation is terminated, the light-irradiating device 16a and the light-receiving device 16b have been moved to respective positions indicated by dotted lines in FIG. 10. In this state, the light-irradiating device 16a and the light-receiving device 16b protrude toward a wafer W from the sensor casings 16c, 16d, respectively. As a result, when there exists a wafer W, an edge of the wafer W extends across an optical path between the light-irradiating device 16a and the light-receiving device 16b. It is preferred that the wafer-detecting sensor 16 is a transmission-type sensor.

When a wafer W is contained in the FOUP 21, since the wafer W blocks the laser beam B1, the light-receiving device 16b does not receive the laser beam B1, whereas when a wafer W is not contained in the FOUP 21, the light-receiving device 16b receives the laser beam B1. The light-receiving device 16b generates an electric signal (detection signal) indicative of whether the laser beam B1 is received, and it is detected based on the detection signal of whether a wafer W is contained in the FOUP 21.

The wafer-detecting sensor 16 detects wafers W while being moved together with the opener 14. More specifically, when the opener 14 is moved downward for opening the lid 23, the wafer-detecting sensor 16 detects which slots of the FOUP 21 from an uppermost one 22a to a lowermost one 22a hold wafers W as it is moved downward together with the opener 14. On the other hand, when the wafer adapter 25 is set in the FOUP 21, the wafer-detecting sensor 16 detects which slots of the wafer adapter 25 from an uppermost one 26a to a lowermost one 26a hold wafers W as it is moved downward together with the opener 14.

As shown in FIG. 10, each of 8-inch wafers W8 set in the wafer adapter 25, and each of 12-inch wafers W12 set on a shelf 22 are received in the FOUP 21 such that respective edges of the wafer W8 and the wafer W12 toward the lid 23 are in the same position. The light-irradiating device 16a irradiates the laser beam B1 in a manner such that the laser beam B1 crosses the wafers W. As described above, since the positions of the end edges of the wafers W8, W12 agree with each other, the wafer-detecting sensor 16 can detect whether wafers W (W8, W12) are contained in the FOUP 21, irrespective of whether the wafers W are of 12-inch or of 8-inch size.

The adapter-detecting sensor 17 is a laser-type optical sensor which detects whether the wafer adapter 25 is set in the FOUP 21, in a non-contacting manner, preferably a reflector-type sensor. The adapter-detecting sensor 17 includes a light-irradiating device 17a for irradiating a laser beam B2, and a light-receiving device 17b for receiving the laser beam B2. The light-irradiating device 17a emits the laser beam B2 toward a front end of a side wall 26 of the wafer adapter 25. The light-receiving device 17b receives the laser beam B2 reflected from the front end of the side wall 26. The light-irradiating device 17a and the light-receiving device 17b are arranged on the opener 14 at locations opposed to the wafer adapter 25. It is preferred that the light-irradiating device 17a and the light-receiving device 17b are arranged on the opposite sides of the light-receiving device 16b of the wafer-detecting sensor 16.

When the wafer adapter 25 is set in the FOUP 21 so as to process 8-inch wafers W8 by the semiconductor manufacturing apparatus 1, the laser beam B2 emitted from the light-irradiating device 17a is reflected by the wafer adapter 25. The light-receiving device 17b receives the reflected laser beam B2. On the other hand, when the wafer adapter 25 is not set in the FOUP 21 so as to process 12-inch wafers W12 by the semiconductor manufacturing apparatus 1, the laser beam B2 emitted from the light-irradiating device 17a is not reflected by the wafer adapter 25, and hence the laser beam B2 reflected is not received by the light-receiving device 17b. The adapter-detecting sensor 17 generates an electric signal (detection signal) indicative of whether the reflected laser beam B2 is received, and based on the detection signal, it is detected whether the wafer adapter 25 is set in the FOUP 21. In other words, the size of wafers W is detected.

Figure 11:
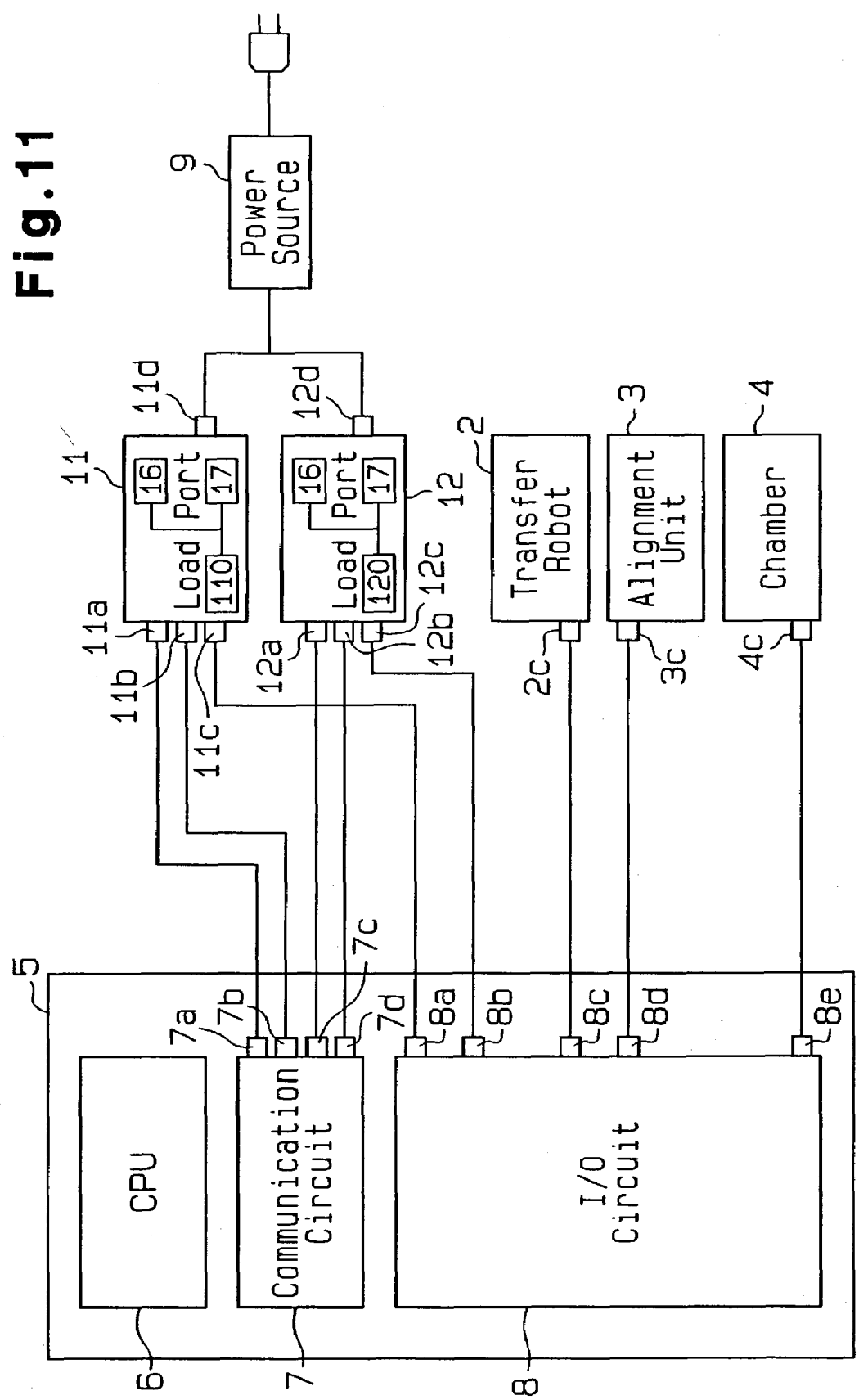
FIG. 11 is a block diagram showing a control unit of the semiconductor manufacturing apparatus of FIG. 5.

Next, the control unit 5 will be described with reference to FIG. 11.

The control unit 5 includes a CPU 6, a communication circuit 7, and an I/O circuit 8. The CPU 6, the communication circuit 7, and the I/O circuit 8 are connected to a general-purpose bus, not shown, for receiving and sending data therebetween.

The CPU 6 carries out a processing program stored in a storage device, not shown, thereby controlling the transfer robot 2, the alignment unit 3, the processing chamber 4, and the load ports 11, 12. The communication circuit 7 includes four communication terminals (first to fourth communication terminals) 7a to 7d for transmitting and receiving communication data between the load ports 11, 12 such that the communication circuit 7 carries out communication processing according to the RS-232C protocol. The I/O circuit 8 includes five signal terminals (first to fifth signal terminals) 8a to 8e for transmitting and receiving digital signals between the transfer robot 2, the alignment unit 3, the processing chamber 4, and the load ports 11, 12, to input and output the digital signals.

The first and second communication terminals 7a, 7b of the communication circuit 7 are connected to first and second communication terminals 11a, 11b of the first load port 11, respectively. The third and fourth communication terminals 7c, 7d of the communication circuit 7 are connected to first and second communication terminals 12a, 12b of the second load port 12, respectively. Each of the load ports 11, 12 includes a communication circuit, not shown, for performing communication processing according to the RS-232C protocol. The respective second communication terminals 11b, 12b of the first and second load ports 11, 12 are used for sending and receiving control information for controlling the opening and closing of the opener 14. The first and second load ports 11, 12 send ID information added to the FOUP 21 to the communication circuit 7 via the first communication terminals 11a, 12a, and deliver and receive the control information for controlling the opener 14 to and from the same and the communication circuit 7 via the second communication terminals 11b, 12b.

The first signal terminal 8a of the I/O circuit 8 is connected to a signal terminal 11c of the first load port 11. The second signal terminal 8b of the I/O circuit 8 is connected to a signal terminal 12c of the second load port 12. The first load port 11 includes an output circuit 110 for supplying the detection signals received from the sensors 16, 17, from the signal terminal 11c to the first signal terminal 8a of the I/O circuit 8. The second load port 12 includes an output circuit 120 for supplying the detection signals received from the sensors 16, 17, from the signal terminal 12c to the second signal terminal 8b of the I/O circuit 8.

The third signal terminal 8c of the I/O circuit 8 is connected to a signal terminal 2c of the transfer robot 2. The transfer robot 2 is controlled by a control signal supplied to the signal terminal 2c thereof. The fourth signal terminal 8d of the I/O circuit 8 is connected to a signal terminal 3c of the alignment unit 3. The alignment unit 3 is controlled by a control signal supplied to the signal terminal 3c thereof. The fifth signal terminal 8e of the I/O circuit 8 is connected to a signal terminal 4c of the processing chamber 4. The processing chamber 4 is controlled by a control signal supplied to the signal terminal 4c.

The first and second load ports 11, 12 have respective power terminals 11d and 12d connected to a power source 9. In each load port, the driving power of the power source 9 is supplied to the motor 15 of the opener 14, the wafer-detecting sensor 16, and the adapter-detecting sensor 17.

Next, the operations of the semiconductor manufacturing apparatus 1 and the first load port 11 will be described. The operation of the second load port 12 is the same as that of the first load port 11, and hence detailed description thereof is omitted.

The FOUP 21a is placed on the first load port 11, and the first load port 11 is moved to the front of the semiconductor manufacturing apparatus 1. The control unit 5 of the apparatus 1 delivers a control signal from the communication circuit 7 to the first load port 11 in response to operation of a start button, not shown. Responsive to the control signal, the first load port 11 enables wafers W contained in the FOUP 21a to be carried into the apparatus 1 in the following manner:

The carrier stage 13 carrying the FOUP 21a thereon is moved forward, and the opener 14 is moved toward the FOUP 21a from the inside of the casing 1a, whereby the first load port 11 is docked with the FOUP 21a. The suction portions 14a of the opener 14 are caused to adhere to the suction receiving portions 23a of the lid 23 of the FOUP 21a, whereby the opener 14 and the lid 23 are properly aligned with each other. Then, the locking levers 14b of the opener 14 are inserted into the locking holes 23b of the lid 23 of the FOUP 21a and locked. The opener 14 pulls the lid 23 while returning to the inside of the casing 1a, thereby removing the lid 23 from the FOUP 21a. The opener 14 holding the lid 23 is moved downward, whereby the FOUP 21a is opened.

Next, whether the wafer adapter 25 is set in the FOUP 21a is detected in the following manner: First, the opener 14 is moved downward such that the adapter-detecting sensor 17 positioned at the same level as an intermediate height of the wafer adapter 25. The light-irradiating device 17a irradiates the beam B2. If the wafer adapter 25 is set in the FOUP 21a, the beam B2 is reflected by the wafer adapter 25, and hence the light-receiving device 17b receives the reflected beam B2. In this case, the adapter-detecting sensor 17 generates "1" as the detection signal. On the other hand, if the wafer adapter 25 is not set in the FOUP 21a, since the beam B2 is not reflected by the wafer adapter 25, the light-receiving device 17b does not receive the reflected beam B2. In this case, the adapter-detecting sensor 17 generates "0" as the detection signal.

The detection signal from the adapter-detecting sensor 17 is delivered to the control unit 5 via the I/O circuit 8. In response to the detection signal, the control unit 5 determines the size of the wafers W contained in the FOUP 21a. If the detection signal from the sensor 17 is "1", the control unit 5 judges that the wafers W are of 8-inch size, whereas if the detection signal is "0", the control unit 5 judges that the wafers W are of 12-inch size.

Next, a wafer-detecting process (mapping process) for detecting the wafers W contained in the FOUP 21a is carried out. First, the opener 14 is moved to a mapping start position. When the wafers W are of 8-inch size, the mapping start position is set to a position which enables the wafer-detecting sensor 16 to detect a wafer W held in the uppermost slot 26a of the wafer adapter 25. When the wafers W are of 12-inch size, the mapping start position is set to a position where the wafer-detecting sensor 16 faces the uppermost slot 22a of the FOUP 21a.

The light-irradiating device 16a and the light-receiving device 16b are caused to protrude toward a wafer W from the sensor casings 16c, 16d, respectively. The light-irradiating device 16a emits the laser beam B1, and the light-receiving device 16b receives (or does not receive) the laser beam B1, whereby it is detected whether a wafer W is contained in the FOUP 21a. The detection of wafers W is performed while the opener 14 is being moved downward from the mapping start position. This enables the wafer-detecting sensor 16 to detect whether a wafer W is held in each of the slots 22a, 26a from the uppermost one to the lowermost one.

A wafer-containing pitch, that is, the interval between adjacent slots 22a or adjacent slots 26a is different depending on the size of wafers contained therein. More specifically, in the case of 8-inch wafers W8, the interval between adjacent slots 26a of the wafer adapter 25 is 6.35 mm, whereas in the case of 12-inch wafers W12, the interval between adjacent slots 22a of the FOUP 21a is 10 mm. Accordingly, a detecting pitch of the wafer-detecting sensor 16 is varied with the size of wafers contained in the FOUP 21a, in other words, depending on whether the wafer adapter 25 is set in the FOUP 21a.

The control unit 5 generates map data of the slots 22a, 26a holding the wafers W based on the detection signal from the wafer-detecting sensor 16. The control unit 5 controls the transfer robot 2 based on the map data and the size of the wafers W, thereby causing the transfer robot 2 to transfer a wafer W contained in the FOUP 21a to the alignment unit 3.

The control unit 5 controls the alignment unit 3 according to the size of a wafer W, detects an alignment notch formed in the wafer W, and effects alignment of the wafer W based on a result of the detection of the notch. The aligned wafer W is carried into the processing chamber 4, where etch processing is executed on the wafer W depending on the size thereof. After termination of the processing, the wafer W is carried back from the processing chamber 4 to the FOUP 21a from which it was removed, by the transfer robot 2.

According to the present embodiment, the following advantageous effects can be obtained:

The semiconductor manufacturing apparatus 1 has the optical adapter-detecting sensor 17 smaller in size than the conventional CCD camera 36. Since a space for arranging the adapter-detecting sensor 17 is small, it is possible to prevent the apparatus 1 from being increased in size.

The adapter-detecting sensor 17 is capable of detecting the presence or absence of the wafer adapter by a simple construction thereof without being adversely affected by the color of the FOUP 21 and brightness around the sensor 17.

Since the adapter-detecting sensor 17 is less expensive than the CCD camera 36, it is possible to reduce the manufacturing costs of the semiconductor manufacturing apparatus 1.

The adapter-detecting sensor 17 is arranged adjacent to the wafer-detecting sensor 16, and hence it is possible to detect the presence or absence of the wafer adapter 25 without violating the SEMI standards.

The control unit 5 determines the size of wafers W contained in the FOUP 21 based on the detection signal supplied from the adapter-detecting sensor 17 to the I/O circuit 8. Therefore, the semiconductor manufacturing apparatus 1 is capable of carrying out processing according to the size of wafers W.

It should be apparent to those skilled in the art that the present invention may be embodied in many other specific forms without departing from the spirit or scope of the invention. For example, the present invention may be modified as follows:

The adapter-detecting sensor 17 may be arranged in the semiconductor manufacturing apparatus 1.

The adapter-detecting sensor 17 may be arranged on the carrier stage 13, or replaced by a contact-type sensor arranged on the bottom of the FOUP 21.

Although in the present embodiment, the mapping process for detecting wafers W is carried out after detection of the wafer adapter 25, this is not limitative, but the adapter-detecting process may be performed during execution of the mapping process.

Processing other than the etch processing, such as processing for forming a wiring pattern on a wafer W, may be executed in the processing chamber 4.

The present invention may be embodied in a CVD, a PVD, or an apparatus for inspecting surfaces of wafer W for defects.

The present examples and embodiments are to be considered as illustrative and not restrictive and the invention is not to be limited to the details given herein, but may be modified within the scope and equivalence of the appended claims.

What is claimed is:

1. A load port for placing thereon a front-opening type pod accommodating first semiconductor wafers having a first predetermined size, wherein the pod includes a lid and when a wafer adapter is mounted in the pod, the pod is capable of containing second semiconductor wafers having a second predetermined size different from the first predetermined size, the load port comprising:
   an opener for opening the lid of the pod;
   an adapter-detecting sensor for detecting whether the wafer adapter is mounted in the pod; and
   an output circuit in electronic communication with the adapter-detecting sensor for generating an electric signal indicative of a result of detection by the adapter-detecting sensor.

2. The load port according to claim 1, wherein the adapter-detecting sensor is an optical sensor.

3. The load port according to claim 2, wherein the adapter-detecting sensor includes a light-irradiating device for irradiating light toward the wafer adapter, and a light-receiving device for receiving light reflected by the wafer adapter when light is irradiated towards the wafer adapter by the light-irradiating device.

4. The load port according to claim 3, further comprising a wafer-detecting sensor arranged at an upper portion of the opener for detecting whether the pod contains the semiconductor wafers, the light-irradiating device and the light-receiving device being arranged adjacent to the wafer-detecting sensor.

5. The load port according to claim 1, wherein the adapter-detecting sensor detects the wafer adapter when the opener opens the lid of the pod.

6. The load port according to claim 1, wherein the adapter-detecting sensor includes a contact-type sensor arranged on a bottom of the pod.

7. A semiconductor manufacturing apparatus for use with a front-opening type pod accommodating first semiconductor wafers having a first predetermined size, wherein the pod includes a lid and when a wafer adapter is mounted in the pod, the pod is capable of containing second semiconductor wafers having a second predetermined size different from the first predetermined size, the semiconductor manufacturing apparatus comprising:
- a load port on which the pod is placed;
- an opener arranged at the load port for opening the lid;
- an optical adapter-detecting sensor arranged at the load port, wherein the optical adapter-detecting sensor detects whether the wafer adapter is mounted in the pod when the opener opens the lid of the pod, and generates a detection signal; and
- a processing chamber for carrying out at least one processing operation on the semiconductor wafers depending on the size of the semiconductor wafers in accordance with the detection signal.

8. The semiconductor manufacturing apparatus according to claim 7, further comprising:
- a transfer robot for transferring the semiconductor wafers between the pod and the processing chamber after the opener has opened the lid of the pod; and
- a control unit for determining the size of the semiconductor wafers based on the detection signal, and controlling the transfer robot and the processing chamber depending on the size of the semiconductor wafers.

9. The semiconductor manufacturing apparatus according to claim 8, further comprising an alignment unit for effecting alignment of the semiconductor wafer, the control unit controlling the alignment unit depending on the size of the semiconductor wafers.

10. A method for manufacturing semiconductor devices comprising:
- accommodating first semiconductor wafers having a first predetermined size in a front-opening type pod or mounting a wafer adapter in the pod and accommodating second semiconductor wafers having a second predetermined size different from the first predetermined size in the pod;
- setting the pod on a load port;
- opening a lid of the pod;
- optically detecting whether the wafer adapter is mounted in the pod;
- determining the size of the semiconductor wafers contained in the pod based on a result of the detection;
- carrying the semiconductor wafers from the pod to a processing chamber; and
- executing at least one processing operation depending on the size of the semiconductor wafers in the processing chamber.

11. A method for detecting whether a front-opening type pod for containing first semiconductor wafers of a first predetermined size has a wafer adapter mounted therein for accommodating second semiconductor wafers of a second predetermined size different from the first predetermined size, wherein the pod includes a lid, the method comprising:
- setting the pod on the load port;
- bringing an opener into engagement with the lid of the pod and moving the opener downward together with the lid to open the lid; and
- optically detecting whether the wafer adapter is mounted in the pod by a sensor arranged at an upper portion of the opener, while opening the lid.

12. A load port for use with a front-opening type pod capable of containing first semiconductor wafers of a first predetermined size, wherein the pod includes a lid and when a wafer adapter is mounted in the pod, the pod is capable of containing second semiconductor wafers of a second predetermined size different from the first predetermined size, the load port comprising:
- a carrier stage for supporting the pod;
- an opener for opening the lid of the pod by engaging with the lid and moving downward together with the lid; and
- an adapter-detecting sensor arranged at an upper portion of the opener for detecting whether the wafer adapter is mounted in the pod, the adapter-detecting sensor including a light-irradiating device for irradiating light toward the wafer adapter, and a light-receiving device for receiving light reflected by the wafer adapter when light is irradiated towards the wafer adapter by the light-irradiating device.

13. The load port according to claim 12, further comprising a wafer-detecting sensor arranged at the upper portion of the opener for detecting whether the pod contains the semiconductor wafers, the wafer-detecting sensor being arranged between the light-irradiating device and the light-receiving device.

14. The load port according to claim 12, wherein the wafer adapter includes a side wall for supporting peripheries of the second semiconductor wafers, and wherein the adapter-detecting sensor irradiates the light toward the side wall of the wafer adapter.

15. The load port according to claim 14, wherein the opener moves the light-irradiating device and the light-receiving device to a level corresponding to an intermediate height of the side wall of the wafer adapter, and wherein the light-irradiating device irradiates the light at the level corresponding to the intermediate height of the side wall.

16. The load port according to claim 12, wherein the pod is a Front Opening Unified Pod compliant with the SEMI standards, and wherein the first semiconductor wafers are 12-inch wafers, and the second semiconductor wafers are 8-inch wafers.

* * * * *